United States Patent

Satoh et al.

[11] Patent Number: 6,159,644
[45] Date of Patent: Dec. 12, 2000

[54] METHOD OF FABRICATING SEMICONDUCTOR CIRCUIT DEVICES UTILIZING MULTIPLE EXPOSURES

[75] Inventors: Hidetoshi Satoh, Hachioji; Yoshinori Nakayama, Sayama; Masahide Okumura, Sagamihara; Hiroya Ohta, Kodaira; Norio Saitou, Tokorozawa, all of Japan

[73] Assignee: Hitachi, Ltd., Tokyo, Japan

[21] Appl. No.: 09/142,077

[22] PCT Filed: Mar. 6, 1996

[86] PCT No.: PCT/JP96/00542

§ 371 Date: Sep. 1, 1998

§ 102(e) Date: Sep. 1, 1998

[87] PCT Pub. No.: WO97/34319

PCT Pub. Date: Sep. 18, 1997

[51] Int. Cl.[7] .................................................. G03F 9/00
[52] U.S. Cl. ........................ 430/22; 430/30; 430/296; 430/328; 430/942
[58] Field of Search ............................. 430/22, 30, 296, 430/942, 328

[56] References Cited

U.S. PATENT DOCUMENTS 5,989,759  11/1999  Ando et al. .............................. 430/296

FOREIGN PATENT DOCUMENTS

| 62-14927 | 1/1987 | Japan . |
| 62-58621 | 3/1987 | Japan . |
| 62-149127 | 7/1987 | Japan . |
| 62-229830 | 10/1987 | Japan . |
| 63-51635 | 3/1988 | Japan . |
| 1-191416 | 8/1989 | Japan . |
| 1-200622 | 8/1989 | Japan . |

*Primary Examiner*—Christopher G. Young
*Attorney, Agent, or Firm*—Mattingly, Stanger & Malur, P.C.

[57] ABSTRACT

In a semiconductor circuit device fabricating process in which a reduction image projection exposure apparatus and an electron beam exposure apparatus are in a mixed use in its exposure process, pattern position shift errors for each exposure apparatus are measured and corrected at the time of drawing by means of an electron beam drawing apparatus, thereby enhancing the alignment accuracy.

First, a pattern for measuring position shifts is exposed using a stepper and the electron beam drawing apparatus. Then, the position shift errors are measured using an identical coordinate position measuring device. Accidental errors have been mixed in the measurement result at this time. On account of this, measurement data at a certain point are smoothed by taking a summation average with data on the periphery thereof, thus decreasing influences of the accidental errors. Moreover, by inverting positive or negative signs of the data on the position shift errors, the data are made into correction data. Then, the correction data are stored. When an exposure is performed by the electron beam drawing apparatus with the pattern exposed by the stepper as a reference, the correction data for the two apparatuses are transferred to the electron beam drawing apparatus, the two data are added to detected mark positions, and at positions after the addition, pattern position shifts within a wafer surface are determined. At the time of exposure, the exposure is performed at positions obtained by subtracting the correction data from the determined pattern position shifts. This method makes it possible to correct both position shift errors within the wafer surface due to the stepper and position shift errors due to the electron beam drawing apparatus, thus allowing the alignment accuracy to be enhanced. Also, this result makes it possible to enhance yield for products in the fabricating process.

7 Claims, 12 Drawing Sheets

FIG. 2

MEASUREMENT DATA ON X-DIRECTION POSITION SHIFTS

|     | X1          | X2          | X3          | -----  | XNx           |
|-----|-------------|-------------|-------------|--------|---------------|
| Y1  | $\Delta X11$ | $\Delta X21$ | $\Delta X31$ | ----- | $\Delta XNx1$ |
| Y2  | $\Delta X12$ | $\Delta X22$ | $\Delta X32$ | ----- | $\Delta XNx2$ |
| Y3  | $\Delta X13$ | $\Delta X23$ | $\Delta X33$ | ----- | $\Delta XNx3$ |
| ⋮   | ⋮           | ⋮           | ⋮           | ⋮      | ⋮             |
| YNy | $\Delta X1Ny$ | $\Delta X2Ny$ | $\Delta X3Ny$ | ----- | $\Delta XNxNy$ |

MEASUREMENT DATA ON Y-DIRECTION POSITION SHIFTS

|     | X1          | X2          | X3          | -----  | XNx           |
|-----|-------------|-------------|-------------|--------|---------------|
| Y1  | $\Delta Y11$ | $\Delta Y21$ | $\Delta Y31$ | ----- | $\Delta YNx1$ |
| Y2  | $\Delta Y12$ | $\Delta Y22$ | $\Delta Y32$ | ----- | $\Delta YNx2$ |
| Y3  | $\Delta Y13$ | $\Delta Y23$ | $\Delta Y33$ | ----- | $\Delta YNx3$ |
| ⋮   | ⋮           | ⋮           | ⋮           | ⋮      | ⋮             |
| YNy | $\Delta Y1Ny$ | $\Delta Y2Ny$ | $\Delta Y3Ny$ | ----- | $\Delta YNxNy$ |

FIG. 3

| | $X\ell-1$ | $X\ell-1$ | $X\ell+1$ | |
|---|---|---|---|---|
| $Y_{m+1}$ | $\Delta X\ell-1, m+1$ / $\Delta Y\ell-1, m+1$ | $\Delta X\ell, m+1$ / $\Delta Y\ell, m+1$ | $\Delta X\ell+1, m+1$ / $\Delta Y\ell+1, m+1$ | |
| $Y_m$ | $\Delta X\ell-1, m$ / $\Delta Y\ell-1, m$ | $\Delta X\ell, m$ / $\Delta Y\ell, m$ | $\Delta X\ell+1, m$ / $\Delta Y\ell+1, m$ | |
| $Y_{m-1}$ | $\Delta X\ell-1, m-1$ / $\Delta Y\ell-1, m-1$ | $\Delta X\ell, m-1$ / $\Delta Y\ell, m-1$ | $\Delta X\ell+1, m-1$ / $\Delta Y\ell+1, m-1$ | |

FIG. 4

(A WAFER CHUCKED BY A CHUCK HAVING AN IDEAL FLAT PLANE)

(A WAFER CHUCKED BY A CHUCK HAVING A BENDING)

Δx : POSITION SHIFT QUANTITY IN x-DIRECTION
t : WAFER THICKNESS

(a) EXPOSURE PATTERN (b) DISTRIBUTION OF POSITION SHIFT ERRORS

FIG. 7

(a) MARK POSITIONS IN A BASED LAYER AT THE TIME OF STATISTICAL PROCESSING ALIGNMENT (b) DESIGN MARK POSITIONS AND MEASUREMENT MARK POSITIONS o A~I : DESIGN MARK POSITIONS
+ A"~I" : MEASUREMENT MARK POSITIONS
⟷ POSITION SHIFT
0.1 μm (c) POSITION SHIFT CORRECTION AT THE TIME OF ALIGNMENT

P" : MEASUREMENT MARK POSITION
P' : POSITION AFTER CORRECTION FOR POSITION SHIFT CAUSED BY ELECTRON BEAM DRAWING APPARATUS
P : MARK POSITION AT THE TIME OF PATTERN DESIGN $\overrightarrow{P''P'} = (\Delta X\ Cb\ p'', \Delta Y\ Cb\ p'')$  POSITION SHIFT CAUSED BY ELECTRON BEAM DRAWING APPARATUS $\overrightarrow{P'P} = (\Delta X\ Ca\ p', \Delta Y\ Ca\ p')$  POSITION SHIFT CAUSED BY EXPOSURE APPARATUS WHEN A MARK IS FORMED

○——△  POSITION SHIFTS CAUSED BY OPTICAL STEPPER

○——□  POSITION SHIFTS CAUSED BY ELECTRON BEAM DRAWING APPARATUS

＋  POSITION OF THE MARK WHEN A MARK EXPOSED BY OPTICAL STEPPER IS MEASURED BY ELECTRON BEAM DRAWING APPARATUS AT THE TIME OF ALIGNMENT

----------  SHOWING COORDINATE RELATIONSHIP DETERMINED BY ALIGNMENT

●  POSITION OF AN EXPOSED PATTERN

METHOD OF FABRICATING SEMICONDUCTOR CIRCUIT DEVICES UTILIZING MULTIPLE EXPOSURES

TECHNICAL FIELD

The present invention relates to a method of fabricating semiconductor circuit devices, and more particularly, to a method of fabricating semiconductor circuit devices which makes it possible to enhance an alignment at the time of making, in an exposure method, a mixed use of a reduction image projection exposure by means of ultraviolet rays and an electron beam drawing method.

BACKGROUND ART

With semiconductor circuit devices being highly integrated, they are getting more and more microminiaturized. In particular, in a recent large-scale integrated circuit (LSI), dimensions of interconnections of the devices or a dimension of a perforation called a hole, which passes through an interlayer between the devices, have been becoming 0.3 $\mu$m or less. This requires that processes of fabricating the semiconductor circuit devices and apparatuses for fabricating thereof also respond to the high integration and the microminiaturization.

Of the processes of fabricating the semiconductor circuit devices, in an exposure process in which the reduction image projection exposure with ultraviolet rays as a light source has been mainly employed up to now, the response to the microminiaturization has been made through an enhancement in the image resolution achieved by wave shortening of the light source. Unfortunately, for a dimension of 0.3 $\mu$m or less, even the wave shortening of the light source has already approached its limit. Developed accordingly is a technique which aims at exceeding the prior art resolution limit through an employment of a phase-shift mask or a modified illumination. For a hole pattern at 0.2 $\mu$m level, however, it is difficult to resolve the image with the use of the existing optical exposure techniques.

Meanwhile, under study is an employment, at a mass production level, of an exposure method in which an electron beam is used. The electron beam exposure, which is superior in the image resolution, makes it possible to easily form the hole pattern at 0.2 $\mu$m level. However, a prior art exposure method by means of the electron beam is an exposure method based on so-called a one-stroke drawing in which a spot beam or a variable shaped beam is used. This made the throughput ⅒th or less as compared with the optical exposure in which a reduction image projection exposure apparatus is used, thus decreasing the number of wafer sheets exposed per unit of time. For this reason, the employment was not common in the mass production fabrication of the LSIs. In recent years, however, an enhancement in wafer processing time has been achieved in the electron beam drawing method, too, through development of a method such as a cell projection method or a block exposure which allows a range for about 5 $\mu$m angle to be exposed at a time. Thus, the employment in the mass production fabrication is under study.

Then, performed is a study of a method in which, in the exposure process of the processes of fabricating the semiconductor circuit devices, a prior art reduction image projection exposure using as a light source i-rays, KrF excimer laser, and so on and the electron beam exposure are in a mixed use and are selectively employed for each layer, thus making it possible to respond to the high integration and the microminiaturization of the semiconductor. In particular, a hole layer, the image of which is difficult to resolve by means of light, allows a fewer number of drawing shots to be performed in the electron beam exposure as compared with other layers such as interconnections, thus bringing about a higher throughput. On account of this, from the viewpoint of the productivity, too, it is considered to be effective to use the electron beam exposure in the hole layer.

There are a plurality of processes in the exposure process of the processes of fabricating the semiconductor circuit devices, and patterns are superposed in each exposure process on a wafer so as to form the semiconductor circuit devices. Specified is a relative position of upper and lower patterns between the exposed layers. Accuracy of this relative position is called alignment accuracy, and is defined as a shift quantity from a based reference layer of a pattern exposed this time, using as the reference a based pattern exposed and etched already. When making a mixed use of light and an electron beam in the exposure processes, even if a problem of the pattern resolution is solved, it remains unchanged that the alignment accuracy among the patterns in all layers becomes severer as the dimensions are more microminiaturized. Usually, this alignment accuracy is required to be about ⅓rd of a minimum dimension. In the processes in which the minimum dimension of the patterns is 0.2 $\mu$m, the alignment accuracy becomes equal to 0.07 $\mu$m or less. Since the alignment accuracy depends on the exposure processes, an alignment technique is an important element of the exposure techniques. In an alignment method at the time of the exposure, position of an alignment mark exposed and etched in a preceding layer is detected, and values such as a position shift, rotation, and magnification of a chip to be exposed are aligned to the based pattern, then performing the exposure. This alignment system is basically classified into a chip alignment system, in which a mark existing on each chip in a wafer is detected so as to perform the exposure for each chip, and a statistical processing alignment system, in which only a predetermined number of marks in a wafer are detected so as to determine arrangement information on the chips all over the wafer.

JP-A-62-14927 is an example in which the alignment accuracy is clearly described concerning the exposure in the mixed use of light and an electron beam. In this example, a lens distortion, which occurs at the time of exposure by means of an optical reduction image projection exposure apparatus, is determined, and is corrected at the time of exposure by means of an electron beam drawing apparatus. Also, in JP-A-62-229830, a lens distortion, which occurs when a test pattern is exposed by the optical reduction image projection exposure apparatus, is measured by the electron beam drawing apparatus, and the measurement value is stored and corrected by the electron beam drawing apparatus at the time of drawing an actual pattern, thereby aiming at achieving an enhancement in the alignment accuracy. In either of these examples, it is intended that a pattern exposed by the reduction image projection exposure using light, is corrected at the time of exposure with the use of the electron beam.

DISCLOSURE OF THE INVENTION

The alignment accuracy is a summation of errors of pattern positions after exposure from designed positions in a layer to become the reference and in a layer exposed, respectively. The errors from the designed positions are equal to position shift errors of exposed patterns within a wafer surface. In the above-described prior arts, only a position shift error, which is attributed to the lens distortion at the time of exposing a reference layer with light, is detected, and afterwards is corrected at the time of the electron beam drawing. For this reason, unit of a domain for the correction data was set to be 20 mm angle, i.e. a one-time projection domain by means of the optical reduction image projection apparatus, and the correction was made by the electron beam drawing apparatus in harmony with repetition of the projections by means of the optical reduction image projection exposure apparatus. Actually, however, 1) there is a position shift error caused by the electron beam drawing apparatus. 2) Concerning the optical reduction image projection exposure apparatus, too, there is a position shift error other than the lens distortion. Consequently, it is impossible to enhance the alignment accuracy unless a correction is made in which the position shift error due to the electron beam drawing apparatus and the one due to the optical reduction image projection exposure apparatus are each taken into consideration independently. In particular, when employing the statistical processing alignment method as the alignment method, it is impossible to correct a position shift error at a position other than an alignment mark position. This inevitably results in a decrease in the alignment accuracy. A characteristic of the position shift errors occurring inherently in the apparatuses is that they have a comparatively slow variation with reference to the wafer surface. For position variation of 1 mm within the wafer surface, variation quantity of the position shift errors is ±0.05 μm.

The content of the position shift errors can be classified into an accidental error and a systematic error. Here, the accidental error is in connection with a short time stability of an exposure apparatus. Also, the systematic error is an error having a reproducibility, and has a definite cause. The following three are the typical factors which, of the pattern position shift errors, make the systematic error differ depending on the exposure apparatus:

1) Deflection of a wafer owing to a difference in a wafer supporting surface.
2) Mirror configuration, nonorthogonality, and nonstraightness of an interferometer on a stage.
3) Lens distortion in a stepper.

Explained below are the above-mentioned three factors for position shift errors due to the systematic error.

Figure 4:
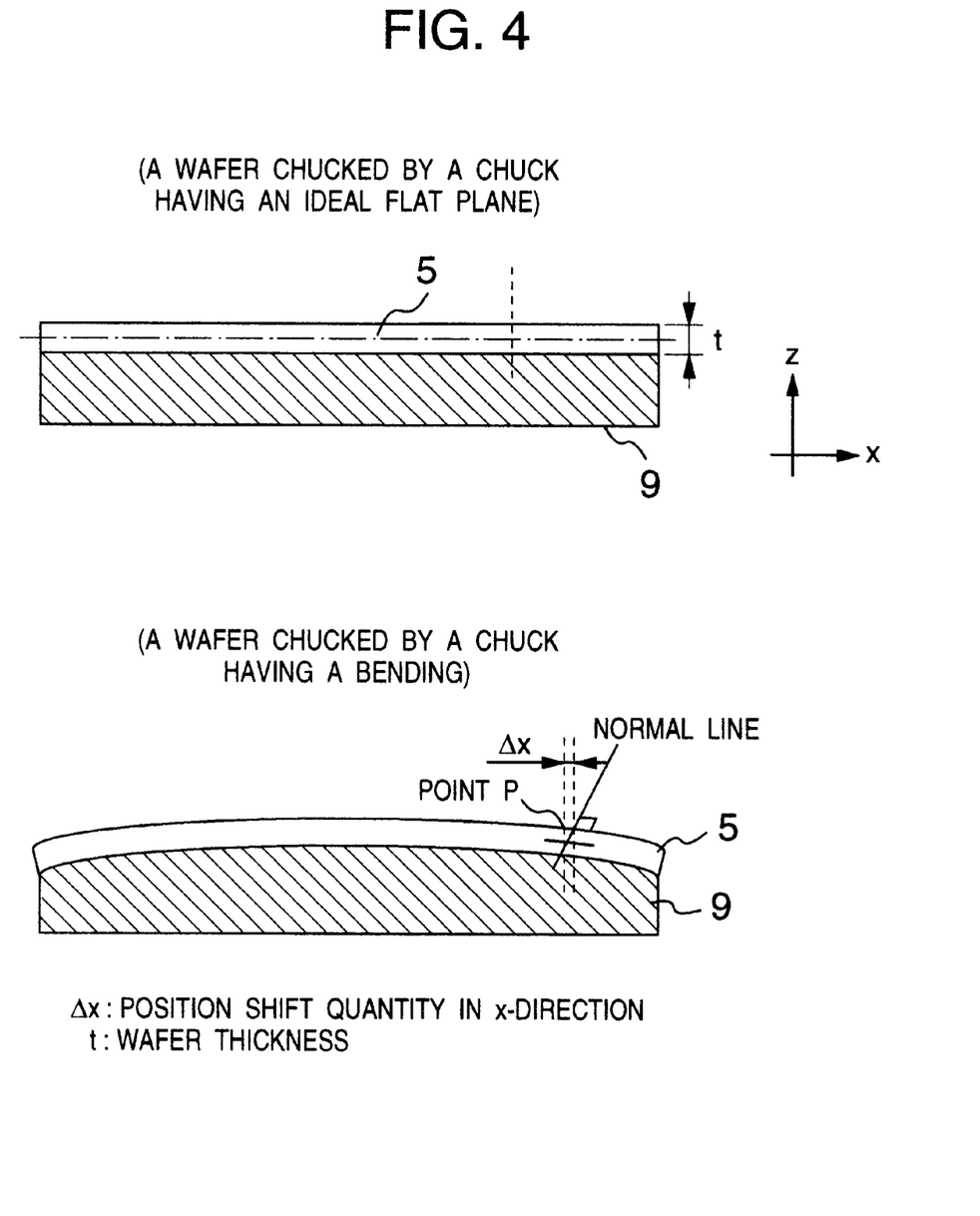
FIG. 4 is a diagram for illustrating position shifts within a wafer due to configuration of a chucking surface.

As shown in FIG. 4, a wafer is exposed in such a state as to be chucked and supported along a chucking surface of a wafer supporter 9 on a stage in an exposure apparatus. This wafer supporter 9 is called a wafer chuck. The wafer supporter 9 supports the wafer by a method of vacuum chucking based on a pressure difference from atmospheric pressure, or by a method in which, with a dielectric film sandwiched between the wafer and an electrode, an electric voltage is applied so as to achieve electrostatic chuck. The exposure apparatus in the optical reduction image projection exposure (a stepper) employs, in many cases, the vacuum chucking. An apparatus such as the electron beam drawing apparatus in which the exposure is performed in vacuum employs the electrostatic chuck. However, since the chucking surface is a machined surface in either of the methods, it can not be made into an ideal flat plane. Owing to this, it turns out that the wafer is exposed in a configuration with a bending. This bending, as shown in FIG. 4, varies positions on a wafer surface, i.e. a surface to be exposed. This position variation quantity is shown in the expression 1.

$$\begin{bmatrix} \Delta x \\ \Delta y \end{bmatrix} = \begin{bmatrix} \frac{t}{2} \times \frac{dZ}{dX} \\ \frac{t}{2} \times \frac{dZ}{dY} \end{bmatrix} \quad (1)$$

Δx: position variation quantity in an x-direction

Δy: position variation quantity in a y-direction t : wafer thickness $\frac{dZ}{dX}$ : differential value in an X-direction $\frac{dZ}{dY}$ : differential value in a Y-direction For example, when the wafer thickness t is 600 μm and the bending of the wafer produces an inclination that, for a moving of 1 mm in an x-direction at a point P in the Figure, the descent is 0.1 μm (the differential value in the expression (1) is $1.0 \times 10^{-4}$), the position variation Δx of the wafer surface becomes 0.03 μm. When the existing exposure process in use of only the optical stepper is replaced by an exposure process in a mixed use of the optical stepper and an electron beam exposure apparatus, an exposure on a different chucking surface is sure to be performed. On account of this, on the occasion when the exposure apparatus differs, the bending of the wafer shown in the above-mentioned embodiment also differs depending on the positions within the wafer. Accordingly, even concerning an identical wafer, the pattern position shift errors based on the optical stepper and the position shift errors based on the electron beam drawing apparatus are different values. Also, in the electron beam drawing apparatus, the electrostatic chuck is equipped with a movable and plate-shaped object called a pallet. In this case, the pallet serves as the wafer supporter. A plurality number of pallets are provided with a piece of the apparatus. On account of this, there arises a problem that, on the occasion when the pallet differs, too, the pattern position shift errors differ.

Figure 5:
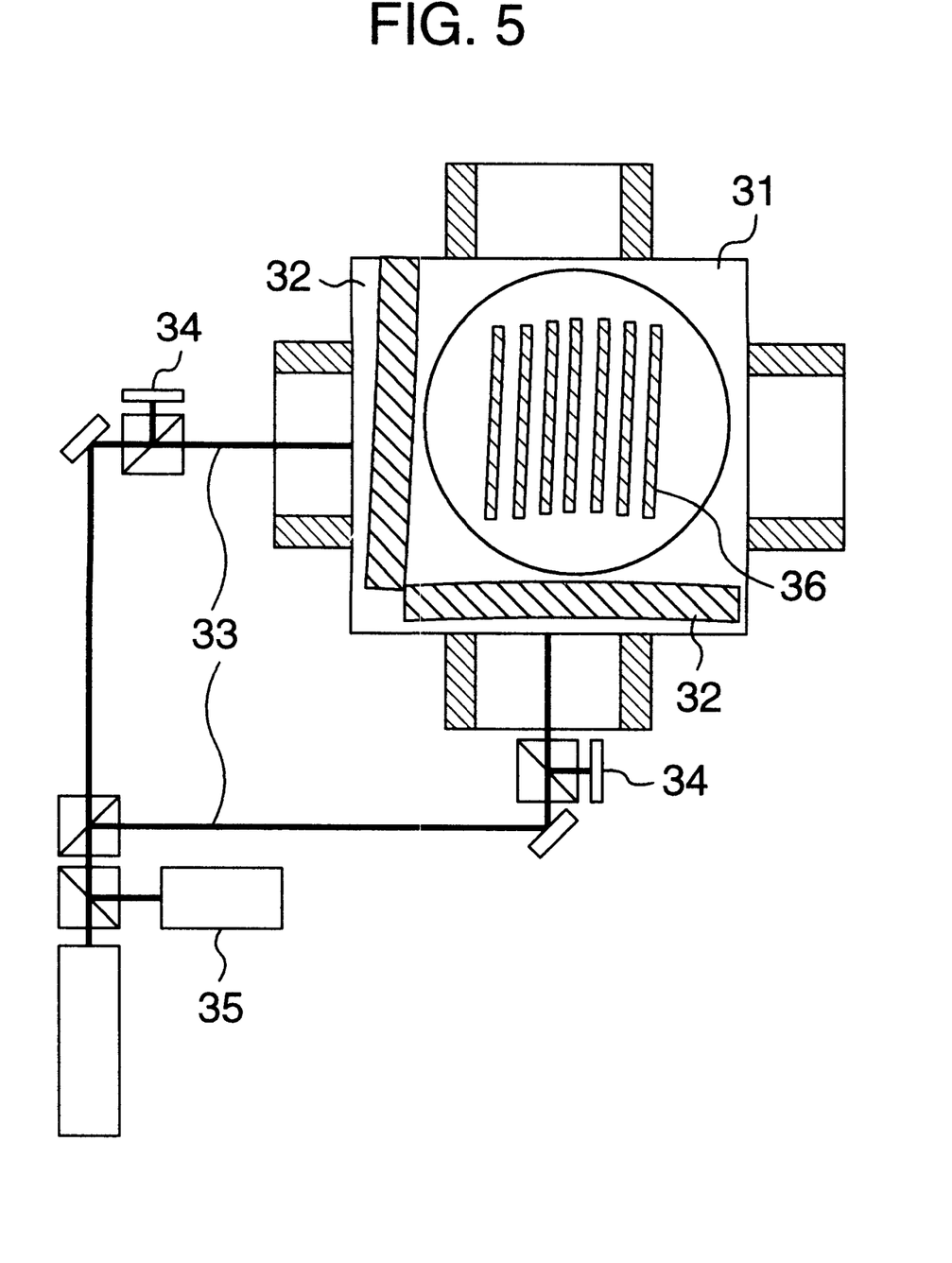
FIG. 5 is a diagram for showing that an exposure apparatus XY stage and an interferometer mirror cause position shifts.

Explained next is pattern position shift errors owing to an interferometer mirror on the stage. In the exposure apparatus, an exposure is performed while moving a stage 31 on which the wafer is mounted. Basically, this stage is moved in two orthogonal X and Y axes directions. Concerning the movement stroke at this time, as shown in FIG. 5, laser light 33, which is reflected on two mirrors 32 having planes parallel to the movement directions of the stage, is made to interfere with laser light reflected on reference mirror surfaces 34, thereby determining, using an interferometer 35, the distance which the stage has covered. Resolving power of this interferometer is about 0.001 μm to 0.01 μm, which is very precise. Also, the mirror surfaces are required to be greater than diameter of the wafer, and thus are 200 mm or more in length. Although the alignment accuracy is now designed to be about 0.05 μm, it is extremely difficult, from the viewpoint of the machining and the fabrication error, to ensure that the nonstraightness due to degree of the orthogonality or the deflection is 0.05 μm or less over 200 mm or more of configuration of the mirrors in the exposure apparatus. However, configuration errors of these two mirrors, as seen from an exposure example of a straight lines pattern 36 shown in FIG. 5, become position shift errors.

Moreover, in the reduction image projection exposure apparatus, since a pattern on the mask is projected using an optical lens, even if the pattern on the mask is ideally formed without error, there occurs a distortion on the exposed surface because of an aberration of the lens. The lens distortion is a position shift error which does not exist in the electron beam drawing apparatus, and thus becomes an alignment error immediately without any change in the case of the mixed use of light and an electron beam. This quantity is equal to 0.04 μm or more in an existing stepper the exposure domain of which is 22 mm angle.

As seen from the above, it is obvious that, in the exposure in the mixed use of a stepper and an electron beam, a systematic error out of the pattern position shift errors differs for each apparatus or for each wafer supporter. Furthermore, an accidental error share other than the above-mentioned systematic error share are added to position shift errors after an actual exposure, and thus a distribution of the alignment error after drawing becomes even more complicated. This makes it difficult to estimate the systematic error by the cause, and separate and correct it.

Figure 11:
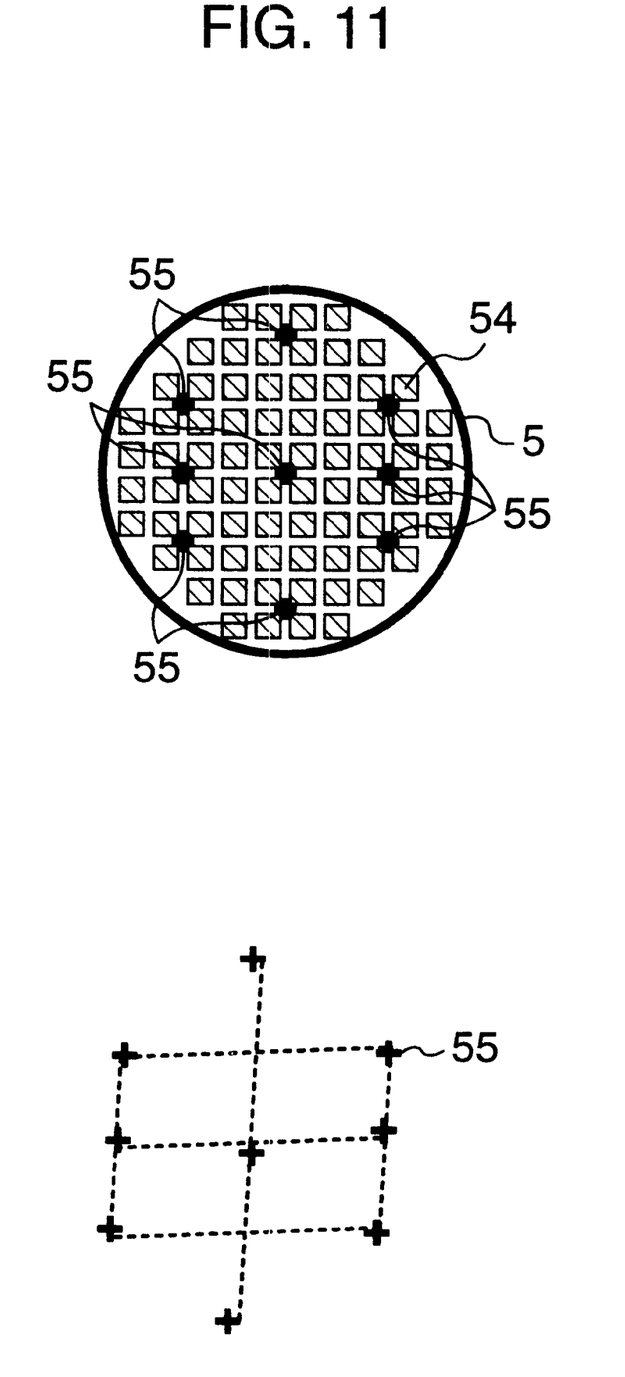
FIG. 11 are diagrams for explaining mark coordinate positions within a wafer at the time of a statistical processing alignment.

The explanation will be given below concerning a process of a decrease in the alignment accuracy due to the pattern position shift errors. Assumed here is a process in which a pattern exposed by the stepper is taken as a reference of a based layer, and an upper layer therefor is exposed by the electron beam drawing apparatus. The alignment is performed by the statistical processing alignment system with a high throughput. This statistical processing alignment is a system in which mark positions of points which are 5 to 50 in number within the wafer are detected so as to determine all the exposure positions within the wafer with the use of the position data. Indicated below, using FIG. 11(a), is an example of the statistical processing alignment. Marks 55, which are as illustrated in FIG. 11(a) and formed in the based layer within the wafer, are detected, differences ($\Delta Xi$, $\Delta Yj$) ($1 \leq i \leq N$, $1 \leq j \leq N$, i, j are integers) between coordinates of these detection data (Xi, Yj) ($1 \leq i \leq N$, $1 \leq j \leq N$, i, j are integers) and design data coordinates (Xdi, Ydj) are created, undetermined coefficients a0 to a3, and b0 to b3 shown in the expressions 2 to 3 are determined using a least-squares method, and the expressions 4 to 5 representing pattern position coordinates at the time of exposure are determined using the design coordinates.

$$\Delta Xi = Xi - Xdi = a0 + a1 \cdot Xdi + a2 \cdot Ydj + a3 \cdot Xdi \cdot Ydj \quad (2)$$

$$\Delta YJ = Yj - Ydj = b0 + b1 \cdot Xdi + b2 \cdot Ydj + b3 \cdot Xdi \cdot Ydj \quad (3)$$

$$X = \Delta Xd - Xd = a0 + a1 \cdot Xd + a2 \cdot Y + a3 \cdot Xd \cdot Yd + Xd \quad (4)$$

$$Y + \Delta Yd + Yd = b0 + b1 \cdot Xd + b2 \cdot Yd + b3 \cdot Xd \cdot Yd + Yd \quad (5)$$

Then, at the time of exposure, the exposure position coordinates (X,Y) are calculated from each pattern design coordinate with the use of these expressions 4 and 5, then performing the exposure. However, the mark detection data coordinates are in a state in which a summation is made between pattern position shift errors at the time of forming the based marks and pattern position shift errors in the electron beam drawing apparatus at the time of detecting the marks. On account of this, as shown by broken lines in FIG. 11(b), the coordinates within the wafer surface based on the expressions 4 and 5 contain arrangement errors. Furthermore, pattern position shift errors at points other than the points at which the marks are detected exist regardless of the expressions 4 and 5. From the above-mentioned explanation, it is obvious that an alignment accuracy of a pattern exposed in this state is decreased.

In particular, even if a stepper and an electron beam exposure apparatus, which are applied to a process in which the pattern minimum dimension is 0.2 μm, respectively perform the alignment using as a reference marks which they themselves form and thus alignment accuracy at the time of exposure has become 0.07 μm or less, i.e. a requirement therefor, the above-described reasons, at the time of exposure in the mixed use, prevent the requirement for the alignment accuracy from being satisfied.

As described above, it is an object of the present invention to provide a method of fabricating semiconductor circuit devices which, by making a mixed use of the reduction image projection exposure using light and the exposure method using an electron beam, makes it possible to eliminate the apparatus-by-apparatus differences in pattern position shift errors within a wafer surface which arise when the semiconductor circuit devices are fabricated, thus enhancing the alignment accuracy. In particular, the present invention provides a means which is effective when, taking as a reference a pattern exposed by the optical reduction image projection exposure apparatus mainly employed in an actual semiconductor fabricating process, an upper layer therefor is exposed to a pattern by the electron beam drawing apparatus.

The above-described problem can be solved by the following means.

In the reduction image projection exposure by means of light, a range of about 10 mm to 20 mm angle is usually exposed at a one-time exposure. The one-time exposure at this time allows only the rotation and the magnification to be corrected. In the electron beam drawing apparatus, however, a one-time exposure referred to as a shot is at most about 5 μm angle, and positions of all shots are determined for each time by a deflector. This makes it possible to correct a beam irradiation position for each shot. Then, employed in this invention is a means in which a pattern position shift error within the wafer surface is measured for each exposure apparatus or for each wafer supporter in the electron beam drawing apparatus, a value obtained by inverting the positive or negative sign is stored as correction data at the point, and is corrected at the time of exposure with an electron beam, thereby decreasing the pattern position shift errors caused by the apparatuses. As a result, it becomes possible to enhance the alignment accuracy.

Figure 6:
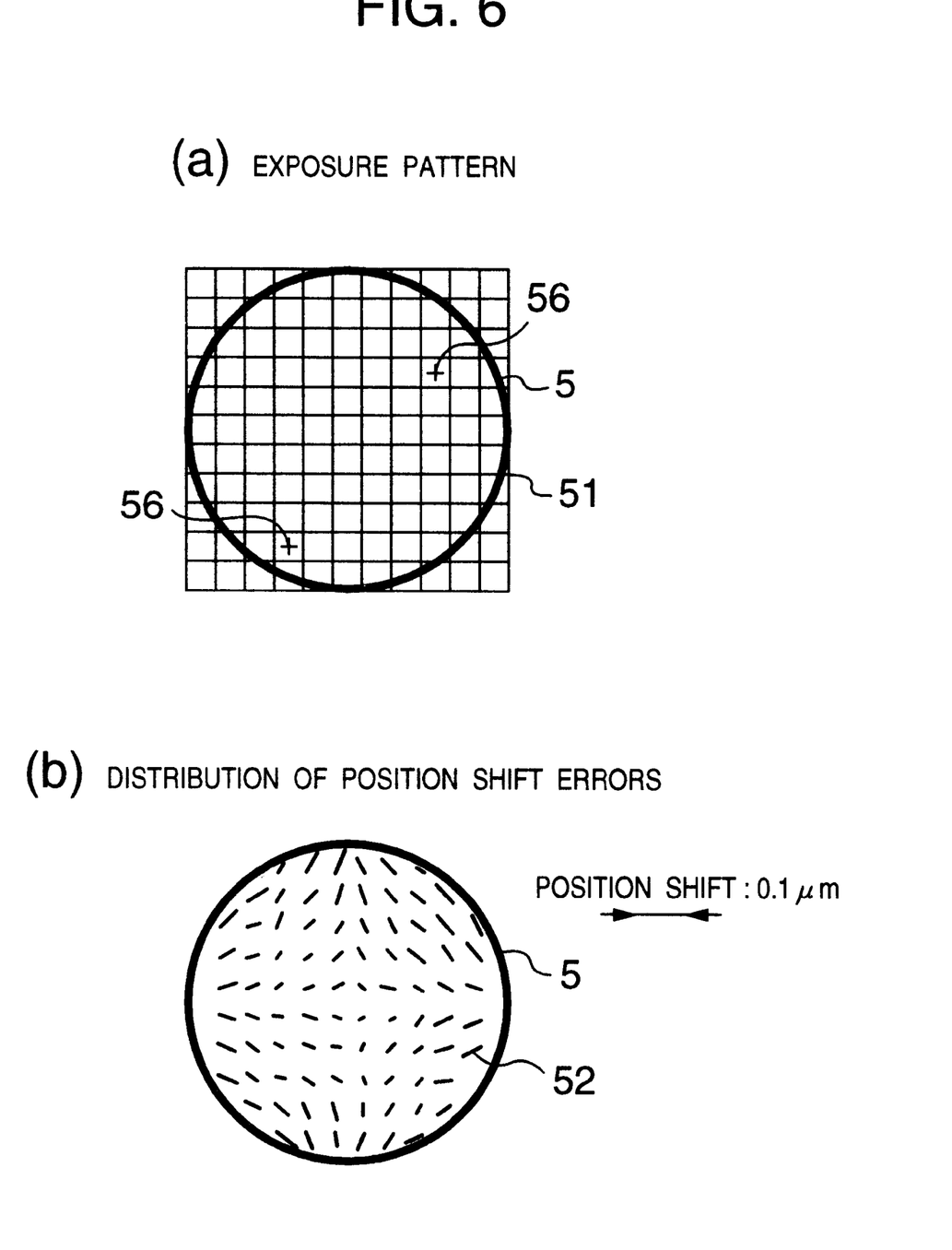
FIG. 6 are diagrams for showing pattern positions for measuring position shifts within a wafer and a distribution of position shift errors.

In order to embody the method in the present invention, the following procedure is needed. First, using all the exposure apparatuses in the process including the optical stepper and the electron beam drawing apparatus, two-points mark positions 56 provided in advance are taken as references and a lot of patterns are exposed with a fixed spacing within the wafer surface (FIG. 6(a)). Although the marks 56 provided in advance are references for aligning rotation of the wafer with shift thereof at the times of the exposure and the coordinate measurement later, position relationship between the marks need not be clear. Then, using one unit of coordinate measuring device, all the pattern positions created by each exposure apparatus are measured. Then, by making measurement values of the pattern positions created by each exposure apparatus correspond to the pattern design coordinates, shift quantities from the positions are determined. Position shift errors are the shift quantities from the pattern design data at the time of the measurement made by the coordinate measuring device. At this time, rotation of the wafer between each exposure apparatus and the coordinate measuring device is ensured by the positions of the two-points mark positions provided in advance. Then, a position shift error at a certain point is smoothed by points on the periphery thereof, and is made into correction data by inverting the positive or negative sign of the smoothed error value at each point, then storing this. Then, correction data in the stepper, which is used for pattern formation of the based layer as a reference, are transferred to the electron beam drawing apparatus. In the electron beam drawing apparatus, an alignment operation is performed prior to the exposure. A mark position detected by the alignment operation has become equal to a value obtained by adding to the actual position a position error caused by the stepper and a position error caused by the electron beam. Thus, added to the detected mark positions are a correction value of the pattern position shift error due to the stepper and a correction value of the pattern position shift error due to the electron beam drawing apparatus. Since data after the addition contain no position shift errors caused by the exposure apparatuses, the arrangement between each point becomes positions based on the design data. Thus, with reference to these mark positions after the addition, positions of all the patterns to be exposed are determined using the expressions (2) to (5). Then, at the time of exposure by means of an actual electron beam, the correction data share for the stepper and the electron beam drawing apparatus are subtracted for all the exposure patterns, and a position of each exposure pattern is aligned with a position of an actual based pattern on the electron beam drawing apparatus, then performing the exposure.

The application of the above-described method, even when making a mixed use of the reduction image projection exposure by means of the stepper and the electron beam drawing apparatus in a semiconductor fabricating process, makes it possible to provide an exposure method which satisfies the image resolution and the alignment accuracy even for a pattern of 0.2 $\mu$m or less. Moreover, although the three factors for the alignment error are indicated in the problem, these are representative ones and the method in the present invention makes it possible to correct all the systematic errors other than these which are attributed to a decrease in the alignment accuracy.

BEST MODE FOR CARRYING OUT THE INVENTION

An object of the present invention is to provide an exposure method which, even when making a mixed use of the reduction image projection exposure by means of the stepper and the electron beam drawing apparatus in a semiconductor fabricating process, satisfies the image resolution and the alignment accuracy even for a pattern of 0.2 $\mu$m or less.

Explained concretely below, using the drawings, is a semiconductor circuit device fabricating method in the present invention.

Figure 1:
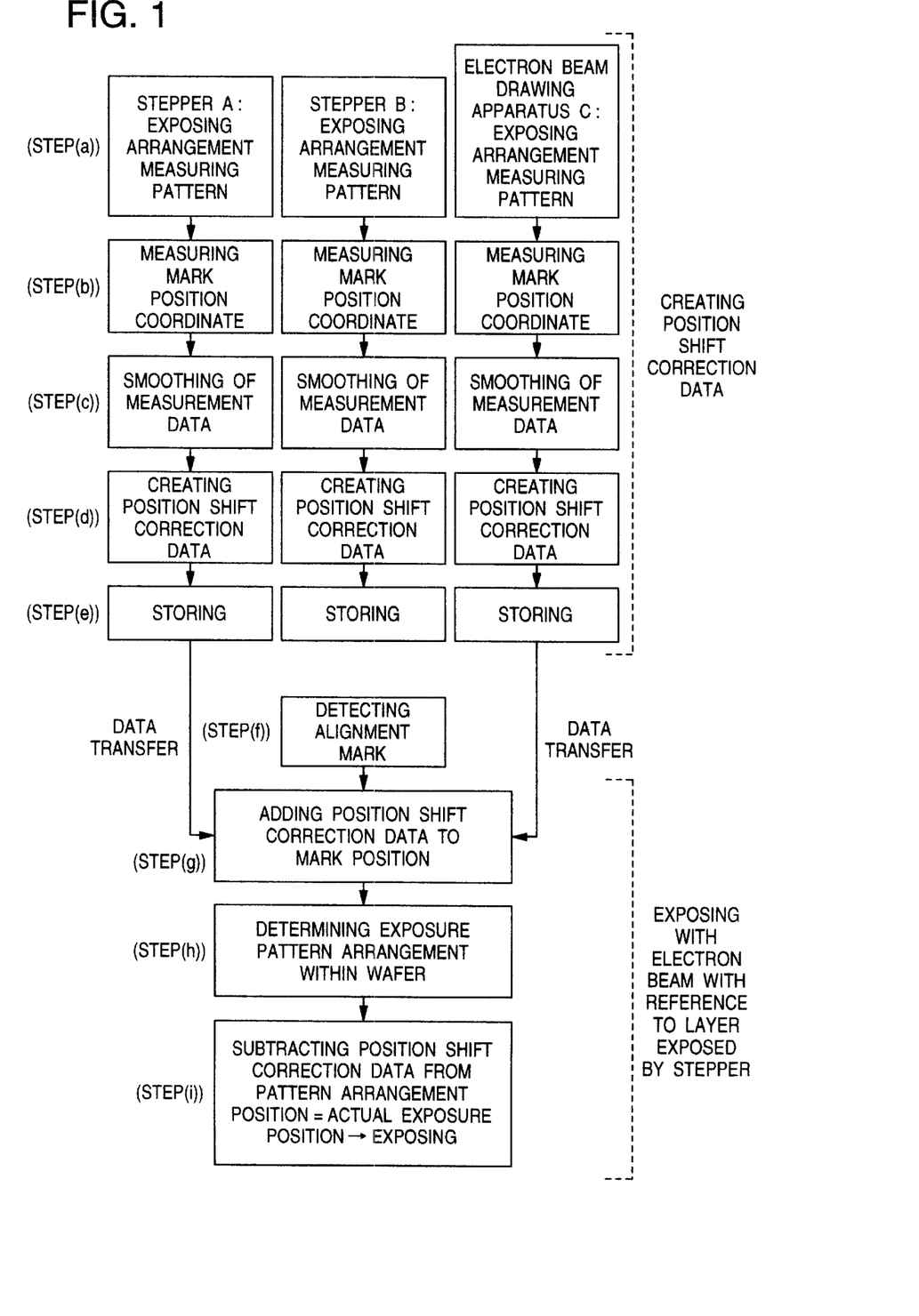
FIG. 1 shows a semiconductor device fabricating method in the present invention.

FIG. 1 is a diagram for showing a flow of the semiconductor device fabricating method in the present invention. First, using both an optical reduction image projection exposure apparatus (a stepper) and an electron beam drawing apparatus, which are employed in a semiconductor fabricating process, a pattern for position shift measurement is exposed (FIG. 1: step(a)). At this time, taking as references the two-points mark positions 56, which are shown in FIG. 6(a) and provided in advance, the pattern is exposed using coordinates of the exposure apparatuses. FIG. 6(a) shows location on design of the pattern to be exposed. This pattern is a pattern in which marks 51, the position shifts of which are measurable within a wafer surface, are located with a fixed spacing in a lattice-like form. The marks 51 are located at all points at which the straight lines intersect with each other within a wafer 5. At this time, an exposure by means of the stepper necessitates a mask, i.e. an original drawing of the pattern. Position errors of a pattern within the mask are superimposed as systematic errors on measurement after the exposure. However, since position shift accuracy of the pattern within the mask is about 0.04 $\mu$m all over the surface of a 0.2 $\mu$m-pattern mask on which there are patterns over a domain of 120 mm angle and at the same time the position shift accuracy is reduced/projected down to ⅕th by the stepper, it is smaller as compared with the alignment accuracy of 0.07 $\mu$m and thus negligible.

Figure 2:
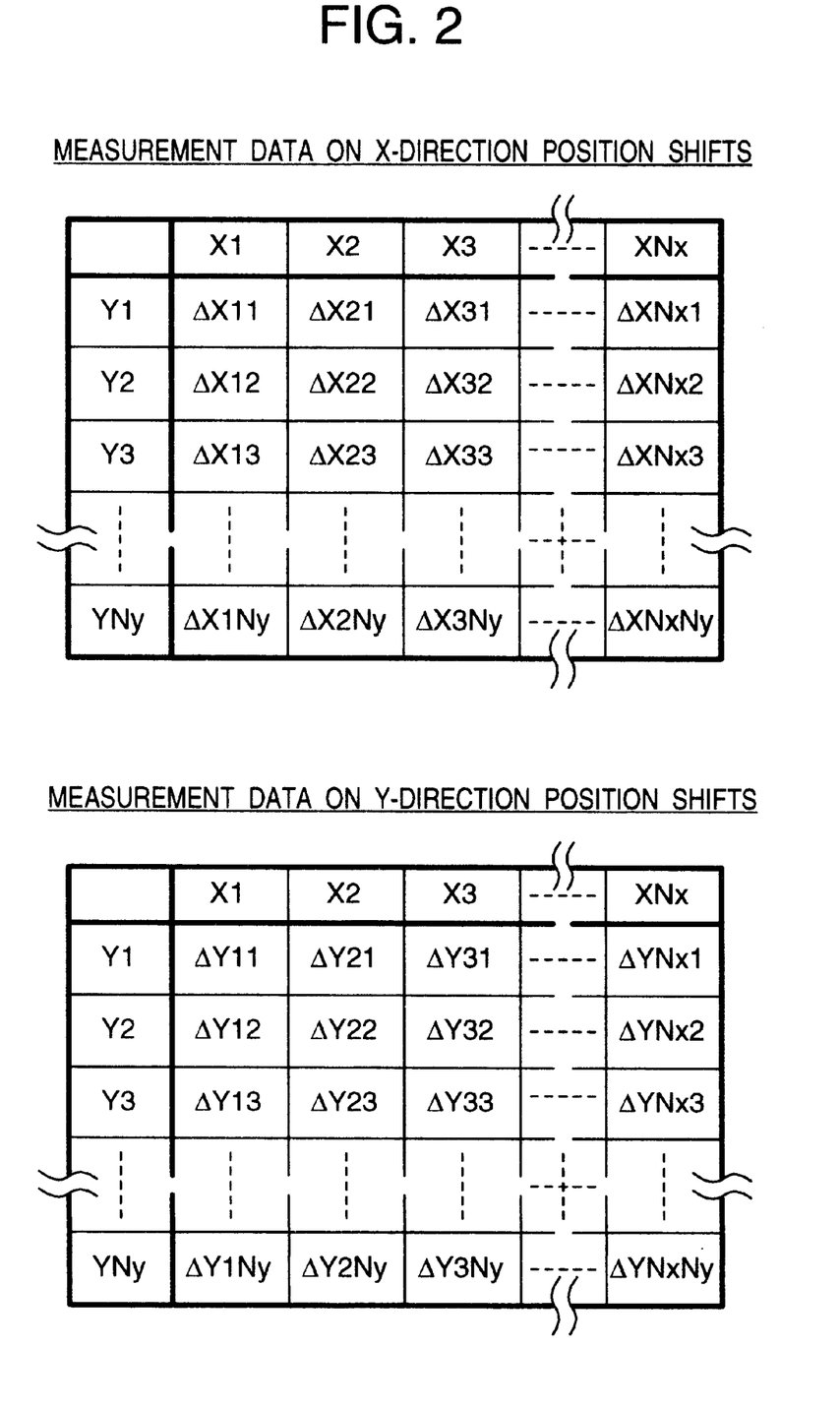
FIG. 2 shows an example of a form of measurement data on pattern position shifts.

Moreover, after developing and further etching wafers exposed by each of the exposure apparatuses, coordinate measurement is performed concerning all the mark positions for every wafer, using one unit of coordinate measuring apparatus as a reference (FIG. 1: step(b)). In the coordinate measurement at this time, rotations and positions of the wafers are aligned using the two-points mark positions 56 shown in FIG. 6(a). From this measurement result, the position shift errors can be determined. Illustrated in FIG. 6(b) is an example of a distribution of the position shift errors. In FIG. 6(b), an example of measurement result of Nx×Ny-points marks within a wafer is indicated by heavy lines as shifts from positions at the time of the pattern design. FIG. 2 shows this measurement result, letting the position shift errors be ($\Delta Xl,m$, $\Delta Yl,m$) in correspondence with Nx×Ny-points mark design coordinates (Xl, Ym) ($1 \leq l \leq Nx$, $1 \leq m \leq Ny$: l, m are integers) existing within the wafer.

Added to this measurement result are position shift errors which the apparatuses have when a wafer is exposed to the marks and position shift errors which the coordinate measuring device has. This, however, gives no problem because the measuring device used now has a one-order higher performance in the position measurement accuracy as compared with the values of the position shifts regarded as a problem in the present invention.

Figure 3:
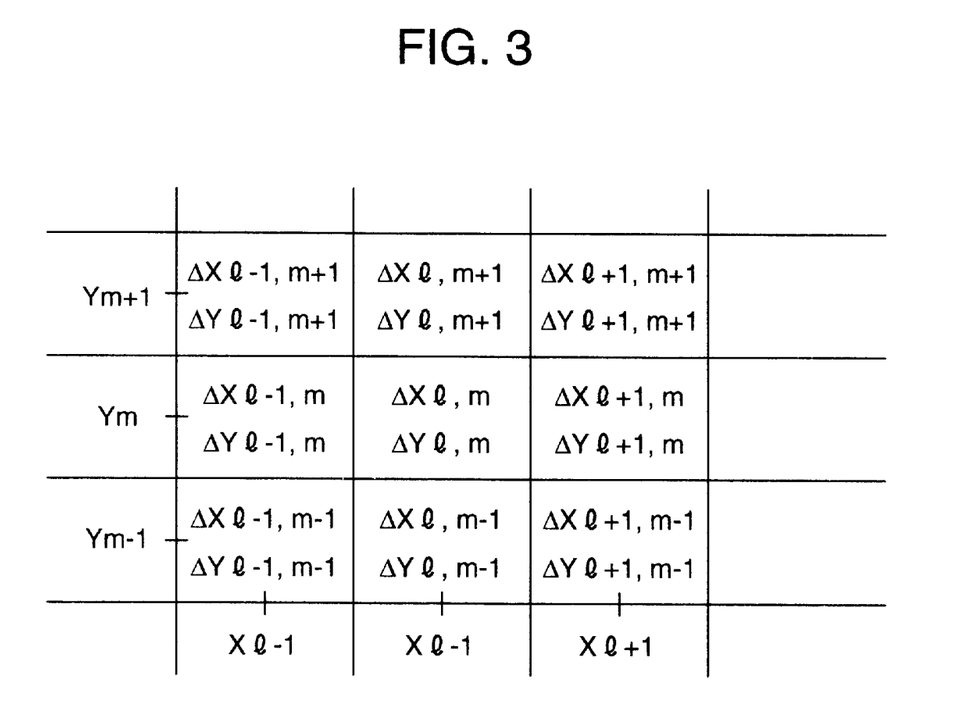
FIG. 3 shows an example of measurement data form of pattern position shifts at a certain point and on the periphery thereof.

Also, the position shift measurement data ($\Delta Xl,m$, $\Delta Yl,m$) at the Nx×Ny-points contain components of both systematic errors and accidental errors in the pattern position shift errors by means of the exposure apparatuses. The present invention, by correcting the systematic errors out of these, aims at improving alignment accuracy in the mixed use of the stepper and the electron beam drawing apparatus. On account of this, it is desirable not to include the accidental errors in data for the correction of the systematic errors. Then, by employing a method shown in FIG. 3 and in the expressions 6 and 7, the position shift correction data are smoothed, thereby performing reductions in the accidental errors. This is because the accidental errors have variations among measurement data on the periphery. The systematic errors, however, are attributed to habits characteristic of the apparatuses, depend on the pattern position, and have a reproducibility. Owing to this, the variations among data on the periphery are small. Thus, by performing the smoothing together with the data on the periphery, it becomes possible to reduce influences of the accidental errors and extract only the systematic errors.

$$\Delta XSl, m = \frac{(p-1) \cdot \Delta Xl, m + \sum_{\substack{i=l-1, \\ j=m-1}}^{\substack{l+1, \\ m+1}} \Delta Xij}{p+8} \quad (6)$$

$$\Delta YSl, m = \frac{(p-1) \cdot \Delta Yl, m + \sum_{\substack{i=l-1, \\ j=m-1}}^{\substack{l+1, \\ m+1}} \Delta Yij}{p+8} \quad (7)$$

$(p > 0)$

In an example in FIG. 3, for position shift data ($\Delta XSlm$, $\Delta YSlm$) at a coordinate (Xl, Ym), the smoothing is performed with the use of position shift measurement data at the point and at 8 points on the periphery, thus creating smoothed position shift data ($\Delta XSlm$, $\Delta YSlm$) (FIG. 1: step(c)).

Then, as shown in the expressions 8 and 9, by inverting the positive or negative sign of this smoothed position shift data ($\Delta XSlm$, $\Delta YSlm$), the data is made into position shift correction data ($\Delta XClm$, $\Delta YClm$) at the coordinate (Xl, Ym) (FIG. 1: step(d)). The step(c) and the step(d) are calculated by a calculating machine within each exposure apparatus to which the coordinate measuring device transfers the position shift data, or by a calculating machine capable of transferring the data from or to each exposure apparatus.

$$\Delta XClm = -\Delta XSl, m \quad (8)$$

$$\Delta YClm = -\Delta YSl, m \quad (9)$$

The coordinate (Xl, Ym) of each point and the position shift correction data ($\Delta XClm$, $\Delta YClm$) corresponding thereto are stored by each exposure apparatus in the fabricating steps, or are transferred so as to be stored to a computer which controls the steps and is capable of carrying out data communication with each exposure apparatus (FIG. 1: step(e)).

Described next is a correcting method and an effect thereof for alignment accuracy in the present invention at the time when a mark pattern formed by the stepper is taken as a reference and an upper layer therefor is exposed to the pattern by the electron beam drawing apparatus.

First, position shift correction data Sa (Xl, Ym, $\Delta XCalm$, $\Delta YCal$) ($1 \leq l \leq Nx$, $1 \leq m \leq Ny$: l, m are integers) for the stepper and position shift correction data Sb (Xl, Ym, $\Delta XCblm$, $\Delta YCblm$) for the electron beam drawing apparatus used at the exposure this time are transferred to a controlling calculating machine in the electron beam drawing apparatus.

Figure 7:
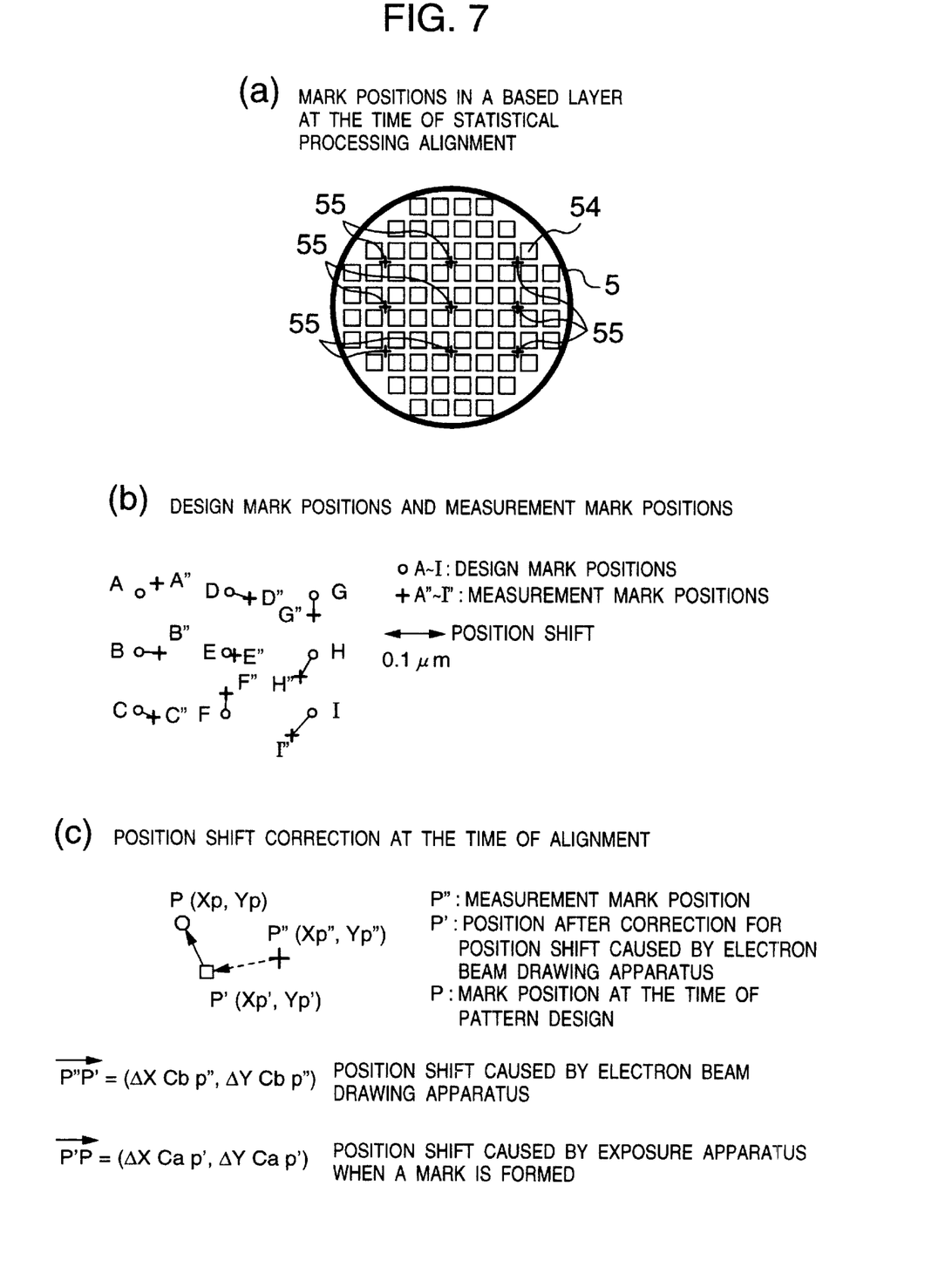
FIG. 7 are diagrams for showing a method of correcting position shifts at the time of a statistical processing alignment according to a method in the present invention.
Figure 12:
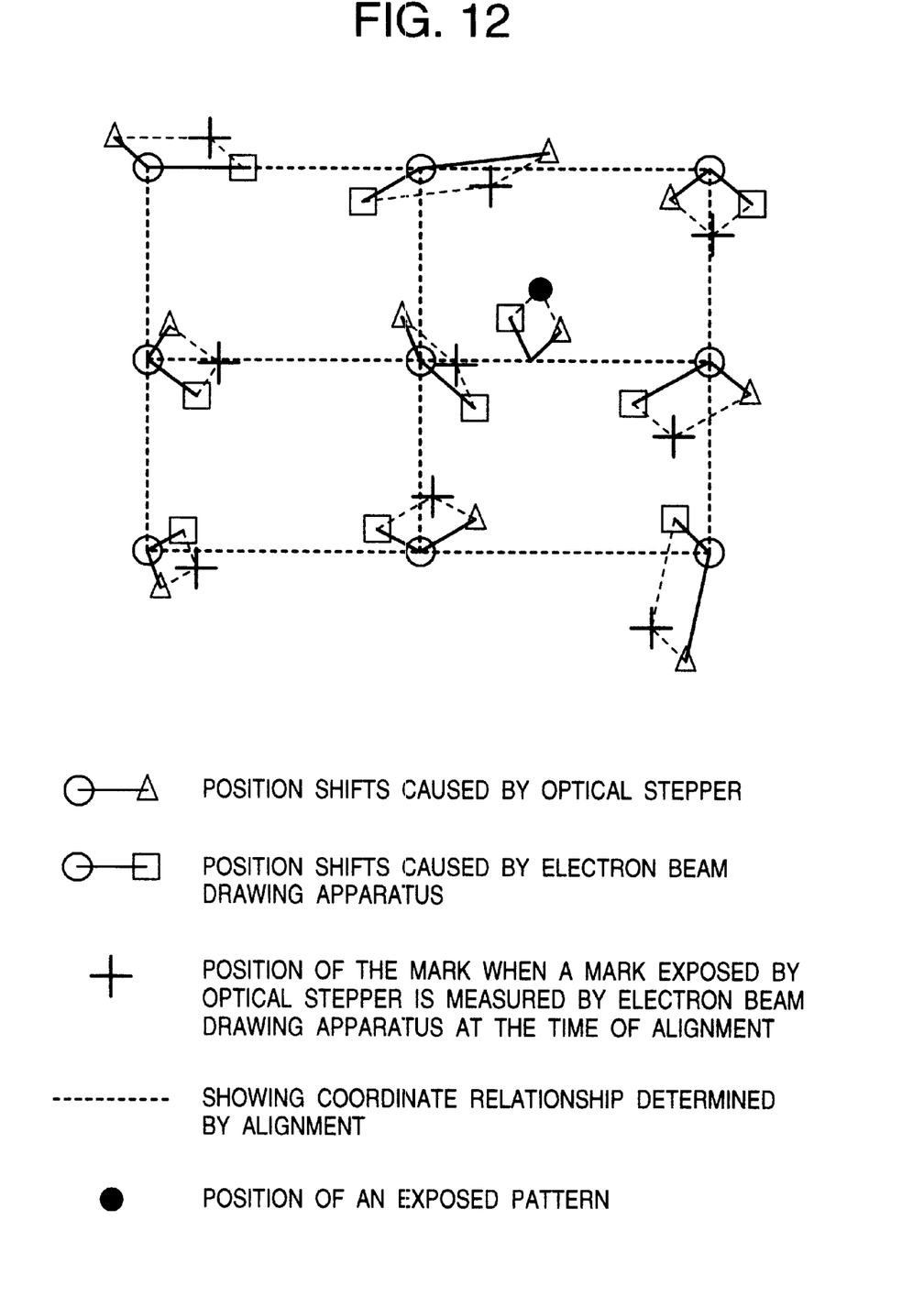
FIG. 12 is a diagram showing position shifts caused by an optical stepper position shifts caused by an electron beam drawing apparatus and also showing the position of the mark when a mark exposed by the optical stepper is measured by an electron beam drawing apparatus at the time of alignment and a position of an exposed pattern.

Employed at the exposure step is a statistical processing alignment which needs less time. Namely, in an example as shown in FIG. 7(a), positions of 9 alignment marks 55, which have been exposed by the stepper and made into a pattern, are detected (FIG. 1: step(f)). At this time, (Xa", Ya")–(Xi", Yi"), i.e. coordinates of mark positions (A"–I") detected by the electron beam drawing apparatus, as shown in FIG. 7(b), differ from (Xa, Ya)–(Xi, Yi), i.e. coordinates of mark positions (A–I) determined from the pattern design values. This is because they contain both position shifts which occur in the stepper when the marks are formed and position shifts which occur in the electron beam drawing apparatus used at the exposure this time. Accordingly, in the electron beam drawing apparatus, values corresponding to the measured mark positions are read out from the position shift correction data Sb ($\Delta XCblm$, $\Delta YCblm$) and the position shift correction data Sa ($\Delta XCalm$, $\Delta YCal$) for the stepper, and to each of the mark positions, corresponding position shift correction values are added (FIG. 1: step(g)). Illustrated in FIG. 6(c) is the way in which the position shift correction values are added. Here, a point P" represents the points (A"–I") and a point P represents the mark positions (A–I) at the time of the pattern design. Moreover, ($\Delta XCbp"$, $\Delta YCbp"$), i.e. position shift correction values for the electron beam drawing apparatus at the point P are indicated as a vector in a broken line. Consequently, a point P' is a position for which the position shifts occurring in the electron beam drawing apparatus have been corrected. Furthermore, ($\Delta XCap'$, $\Delta YCap'$), i.e. position shift correction values which occur in the stepper when the marks are formed, are indicated as a vector in a full line. Theoretically, performing such corrections makes it possible to bring the points A"–I" back to the mark position shifts (A–I) at the time of the pattern design. Actually, employed are coordinates obtained by adding to the detected mark positions the position shift correction values for both the stepper and the electron beam drawing apparatus. Then, using the expressions 2 to 5 with the position coordinates to which the position shift errors by these two apparatuses have been added, approximate polynomials by the least-squares approximation are created, thus deriving expressions representing coordinates within the wafer at the time of exposure. Then, the expressions 4 and 5 determine values such as central positions, rotations, and magnifications of semiconductor device chips to be exposed within the wafer surface. Pattern location determined at this time, as shown by dotted lines in FIG. 12, turns out to be a location close to the design data which contain no position shifts characteristic of the stepper and the electron beam drawing apparatus. A series of operations described above are executed by the controlling calculating machine in the electron beam drawing apparatus.

After the operations comes an exposure by means of the electron beam. Instead of exposing the pattern as the location shown by dotted lines in FIG. 12, the position shift correction values in the electron beam drawing apparatus, i.e. ($\Delta XCbp"$, $\Delta YCbp"$), and the position shift correction values which occur in the stepper, i.e. (ΔXCap', ΔYCap'), are subtracted at all the drawing positions of the pattern. Such a subtraction, just like an example shown by a black circle in FIG. 12, makes it possible to make a drawing at a position corresponding to the position shifts which the electron beam and the stepper produce at the point.

Figure 8:
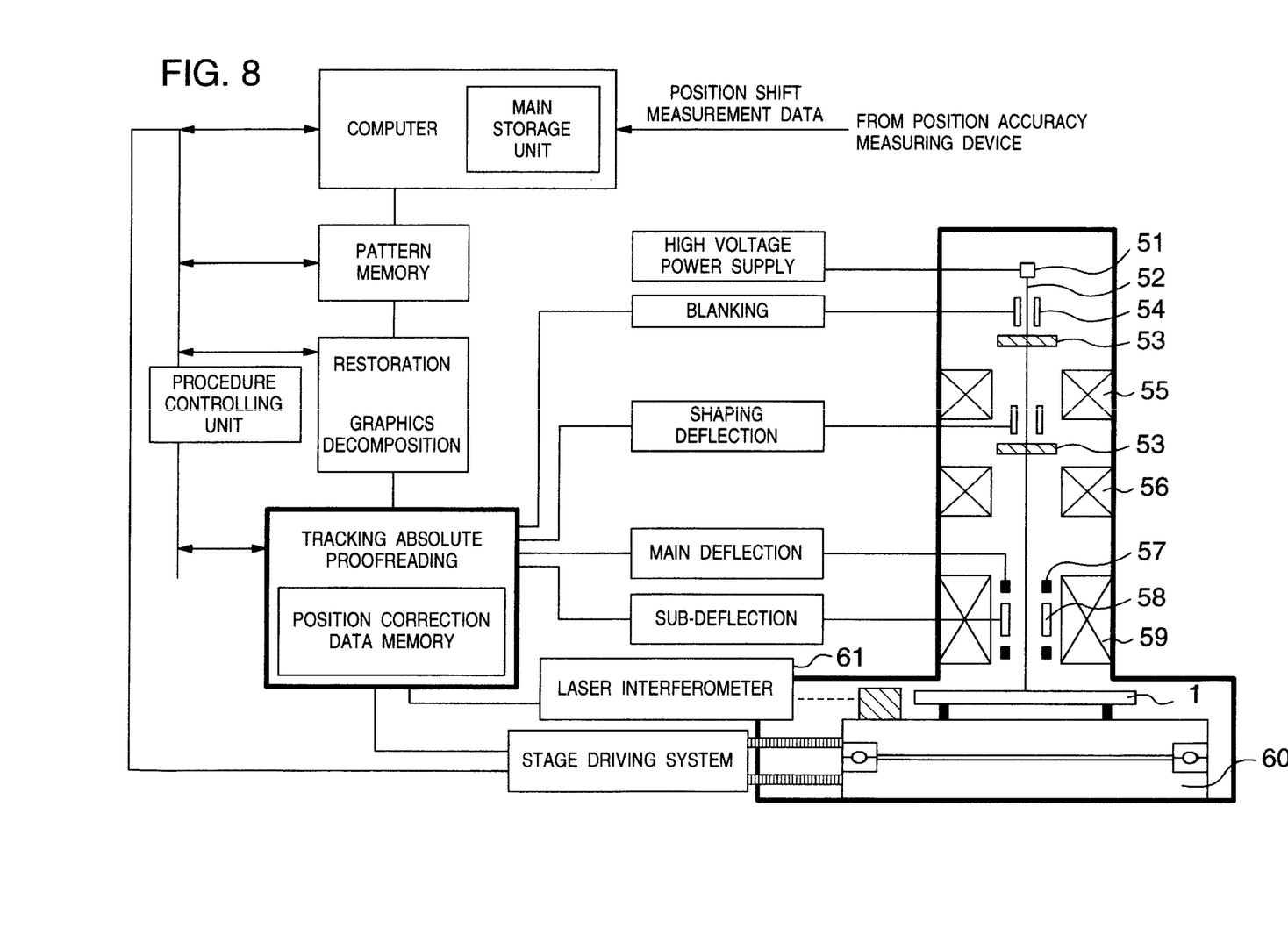
FIG. 8 shows a construction of an electron beam drawing apparatus for embodying the semiconductor device fabricating method in the present invention.
Figure 9:
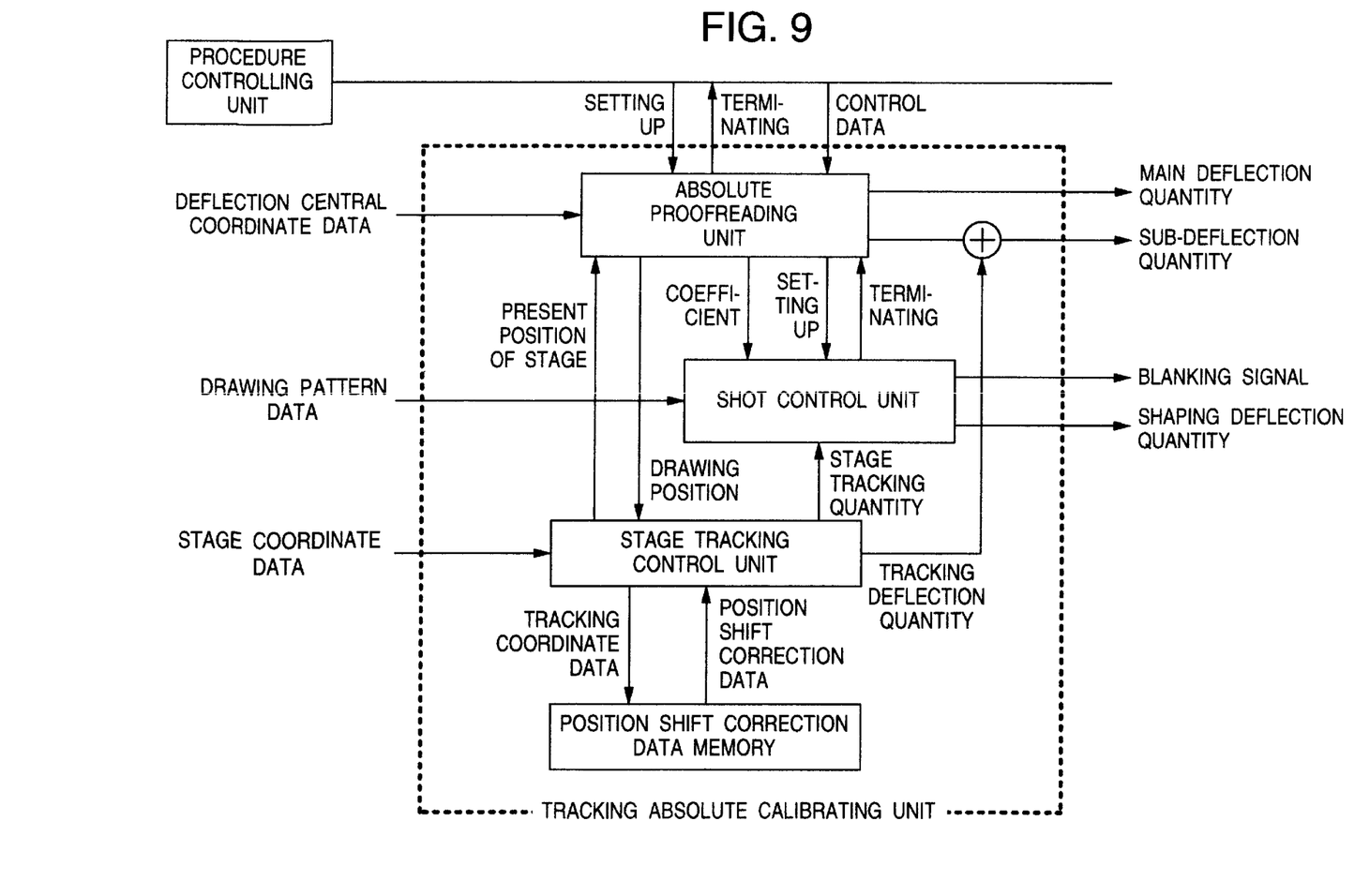
FIG. 9 shows a control unit within the electron beam drawing apparatus for embodying the semiconductor device fabricating method in the present invention.

Explained below, using FIG. 8, is a method of correcting a drawing position at this time within the drawing apparatus. In a drawing apparatus shown in FIG. 8, data, such as drawing pattern data and position shift correction data, are stored in a main storage unit in a computer. This drawing apparatus obeys a system in which the drawing is performed with a stage being moved continuously. On account of this, a tracking absolute calibrating unit, i.e. one of control circuits in the drawing apparatus, calculates and outputs, in real time, calculation blanking, shaping deflection quantity, main deflection quantity, and sub-deflection quantity, using stage coordinate data from a laser interferometer and data from a graphics decomposition unit. Prior to the drawing, out of the position shift correction data stored in the main storage unit in the computer, after inverting positive or negative signs of the position shift correction data Sa (ΔXCalm, ΔYCalm) for the stepper and the position shift correction data Sb (ΔXCblm, ΔYCblm) for the electron beam drawing apparatus used at the exposure this time, they are added and then transferred to a position shift correction data memory. In the drawing, the drawing pattern data are first transferred to a pattern memory and converted into deflection central coordinate data and drawing pattern data for each shot through a restoration/graphics decomposition unit. The drawing data are sent to tracking absolute proofreading data. FIG. 9 shows a detailed configuration of the tracking absolute calibrating unit. In the position shift correcting method in the present invention, next stage coordinates (tracking coordinate data) are sent to a position shift correction memory within this tracking controller so as to output position shift correction data (ΔXClm, ΔYClm) corresponding to the stage coordinates. The position shift correction data (ΔXClm, ΔYClm) output same data unless the stage coordinates exceed either of X l+1, Y m+1. The outputted position shift correction data, which are added to stage tracking quantity in the tracking controller, become tracking correction quantity. Furthermore, the tracking correction quantity, which is added to deflection quantity of an auxiliary deflector, becomes irradiation position of a beam the position shift correction of which has been made.

Indicated next is an embodiment in which the fabricating method in the present invention is applied to an actual fabrication of semiconductor devices.

Figure 10:
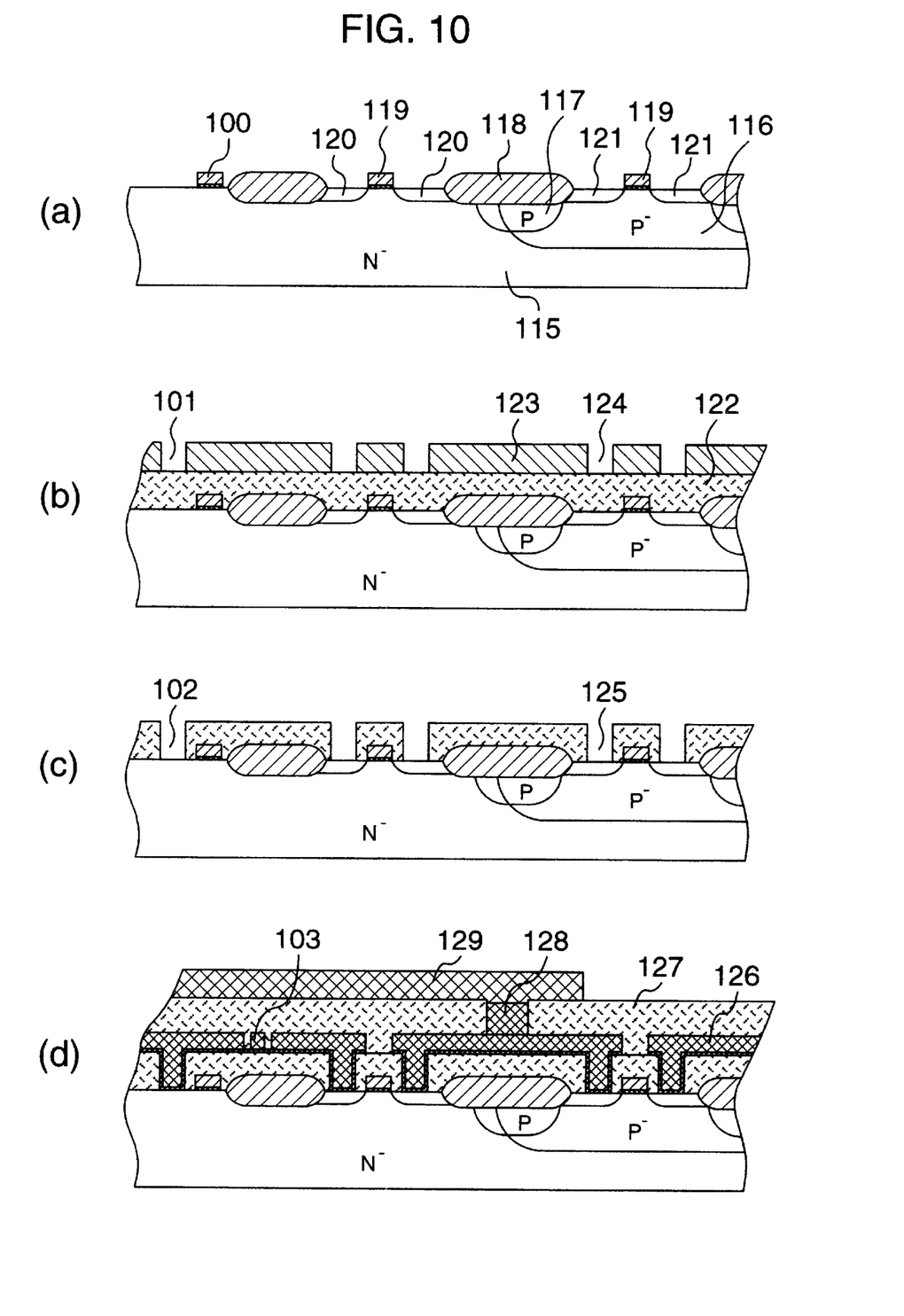
FIG. 10 shows a semiconductor device fabricating method in the present invention.

FIG. 10(a)–FIG. 10(d) are cross sectional views of circuit devices illustrating an actual circuit device fabricating processes using the semiconductor circuit device fabricating method in the present invention. Formed on a N-type silicon substrate 115, in an ordinary method and by means of optical exposure using the reduction image projection exposure apparatus, ate a P well layer 116, a P layer 117, a field oxide film 118, polycrystal silicon/silicon oxide film gates 119, a P high concentration diffusion layer 120, a N high concentration diffusion layer 121, and so on (FIG. 10A). At this time, an alignment mark 100 at the time of next layer exposure is formed simultaneously. Next, an insulating film 122 made of phosphosilicate glass (PSG) is deposited. Resist 123 is coated thereon, and an alignment is performed with the alignment mark 100 as a reference with the use of the electron beam drawing apparatus in the above-mentioned method, thus exposing and forming a hole pattern 124 (FIG. 10B). At this time, a pattern 101 for an alignment mark at the time of next layer exposure is formed simultaneously. Next, with the resist as a mask, dry etching of the insulating film 122 is performed so as to form a contact hole 125 (FIG. 10C). At this time, an alignment mark 102 at the time of next layer exposure is formed simultaneously. Next, a W/TiN thin film is deposited, and after resist is coated thereon, a resist pattern is formed by performing an exposure with the alignment mark 102 as a reference by means of optical exposure using the reduction image projection exposure apparatus, and then a W/TiN electrode interconnection 126 is formed by a successive dry etching. At this time, an alignment mark 103 at the time of next layer exposure is formed simultaneously. Next, an interlayer insulating film 127 is formed. Next, resist is coated, and an exposure is performed with the alignment mark 103 as a reference with the use of the electron beam drawing apparatus, thus forming a hole pattern 128. W plague is buried inside the hole pattern 128, and is connected with an Al second interconnection 129 (FIG. 10D). Concerning a passivation process thereinafter, a prior art method is employed. Incidentally, although only the main fabricating processes are explained in the present embodiment, except that the electron beam drawing apparatus is employed in the exposure process for forming the contact hole, the same process as the case using a conventionally performed optical exposure is employed. Also, concerning the reduction image projection exposure apparatus, an identical apparatus is always employed in order to make the alignment accuracy as high as possible. The above-described processes make it possible to fabricate CMOSLSIs with a high yield. Semiconductor apparatuses were fabricated by the exposure method in the present invention, and as a result, it has been found that a hole pattern the dimension of which is 0.25 μm can be exposed with an excellent image resolution and the alignment accuracy is 0.07 μm or less. This consequence has tremendously enhanced an acceptable item yield for the products.

When an exposure is performed using the method in the present invention, in particular, in the alignment exposure using the statistical processing alignment method, an alignment is carried out by eliminating position shift errors caused by both the stepper and the electron beam drawing apparatus from mark positions detected by the electron beam drawing apparatus. On account of this, the position shift errors caused by the electron beam drawing apparatus were exposed without being corrected at positions at which the alignment is not carried out, thus resulting in a decrease in the alignment accuracy. Further, the above-described method in the present invention was employed so as to precisely grasp the position shifts within a wafer surface for each exposure apparatus, and then the correction was performed using the electron beam drawing apparatus. This has made it possible to accomplish an enhancement in the alignment accuracy even in a semiconductor fabricating process in which the mixed use of the stepper and the electron beam drawing apparatus is made.

What is claimed is:

1. A method of fabricating a semiconductor device, comprising:

a first exposure step of irradiating a mask with light from a light source so as to expose a pattern from the mask to a substrate;

a second exposure step of exposing said pattern to the resulting substrate with the use of an electron beam;

a first measurement step of measuring a predetermined coordinate position in the pattern formed at said first exposure step;

a second measurement step of measuring a predetermined coordinate position in the pattern formed at said second exposure step;

a step of comparing the coordinate position measured at the first measurement step with a design position in said pattern so as to determine a first error quantity;

a step of comparing the coordinate position measured at the second measurement step with the design position of said pattern so as to determine a second error quantity; and drawing with exposure data on said electron beam corrected by said first error quantity and said second error quantity.

2. A method of fabricating a semiconductor device as claimed in claim 1, wherein said first and second error quantities are stored.

3. A method of fabricating a semiconductor device as claimed in claim 1, wherein, in the exposure step with the use of the electron beam, the exposure is performed by making a correction in which, through the use of storage data, position shifts in a based pattern storing the measured coordinate position and position shifts occurring at the time of the exposure are simultaneously taken into consideration.

4. A method of fabricating a semiconductor device as claimed in claim 1, wherein, in said correction, pattern position shifts within a wafer for each of exposure apparatuses or for each wafer supporter in the exposure apparatuses are measured in advance at a plurality of points, position shift quantity at each point is smoothed using position shift data at the point and position shift data at points on the periphery thereof so as to be made into position correction quantity, and then the position correction quantity is stored.

5. A method of fabricating a semiconductor device as claimed in claim 1, wherein, in said correction, the smoothing of the position shift quantity at east point by use of the position shift data at the point and the position shift data at the points on the periphery thereof is performed by a summation average.

6. A method of fabricating a semiconductor device as claimed in claim 1, wherein the position shift data on the pattern are capable of being transferred between the exposure apparatuses or between an exposure apparatus and a coordinate measuring device.

7. A semiconductor device fabricating equipment which makes possible the methods described in claim 1.

* * * * *